(12) United States Patent
Nakatake

(10) Patent No.: US 6,177,294 B1
(45) Date of Patent: Jan. 23, 2001

(54) WIRING LAYOUT METHOD FOR SEMICONDUCTOR DEVICE AND RECORDING MEDIUM ON WHICH WIRING LAYOUT PROGRAM FOR SEMICONDUCTOR DEVICE IS RECORDED

(75) Inventor: Kenichi Nakatake, Kanagawa (JP)

(73) Assignee: NEC Corporation, Tokyo (JP)

( * ) Notice: Under 35 U.S.C. 154(b), the term of this patent shall be extended for 0 days.

(21) Appl. No.: 09/176,996

(22) Filed: Oct. 22, 1998

(30) Foreign Application Priority Data

Oct. 28, 1997 (JP) .................................................. 9-295628

(51) Int. Cl.⁷ .................................................. H01L 21/44
(52) U.S. Cl. ........................ 438/106; 438/115; 438/116
(58) Field of Search .................................. 438/106, 115, 438/116

(56) References Cited

U.S. PATENT DOCUMENTS

| | | | |
|---|---|---|---|
| 4,893,170 | * 1/1990 | Tokuda et al. | 357/71 |
| 5,187,555 | * 2/1993 | Kuroda et al. | 257/202 |
| 5,223,733 | * 6/1993 | Doi et al. | 257/386 |
| 5,300,798 | * 4/1994 | Yamazaki et al. | 257/207 |
| 5,422,241 | * 6/1995 | Iruka | 174/250 |
| 5,434,453 | * 7/1995 | Yamamoto et al. | 257/777 |
| 5,895,887 | * 4/1999 | Takata et al. | 174/52.4 |

FOREIGN PATENT DOCUMENTS

| | | |
|---|---|---|
| 01239964 | 9/1989 | (JP) . |
| 05055380 | 3/1993 | (JP) . |

\* cited by examiner

*Primary Examiner*—Richard Elms
*Assistant Examiner*—Michael Lebentritt
(74) *Attorney, Agent, or Firm*—Scully, Scott Murphy & Presser

(57) ABSTRACT

The number of elements, an element area, an inter-element wiring region, and the minimum necessary power supply wiring layer region are estimated, and a chip area and a chip region are determined on the basis of the estimation result. Elements are arranged in the chip region, and wirings for connecting the elements to each other are formed. Thereafter, the shapes of the power supply wiring layer and the ground wiring layer connected to the elements and oppositely arranged to be spaced apart from each other in the direction of the thickness of the chip are determined. The power supply wiring layer and the ground wiring layer are designed such that the counter area therebetween is made as large as possible.

11 Claims, 6 Drawing Sheets

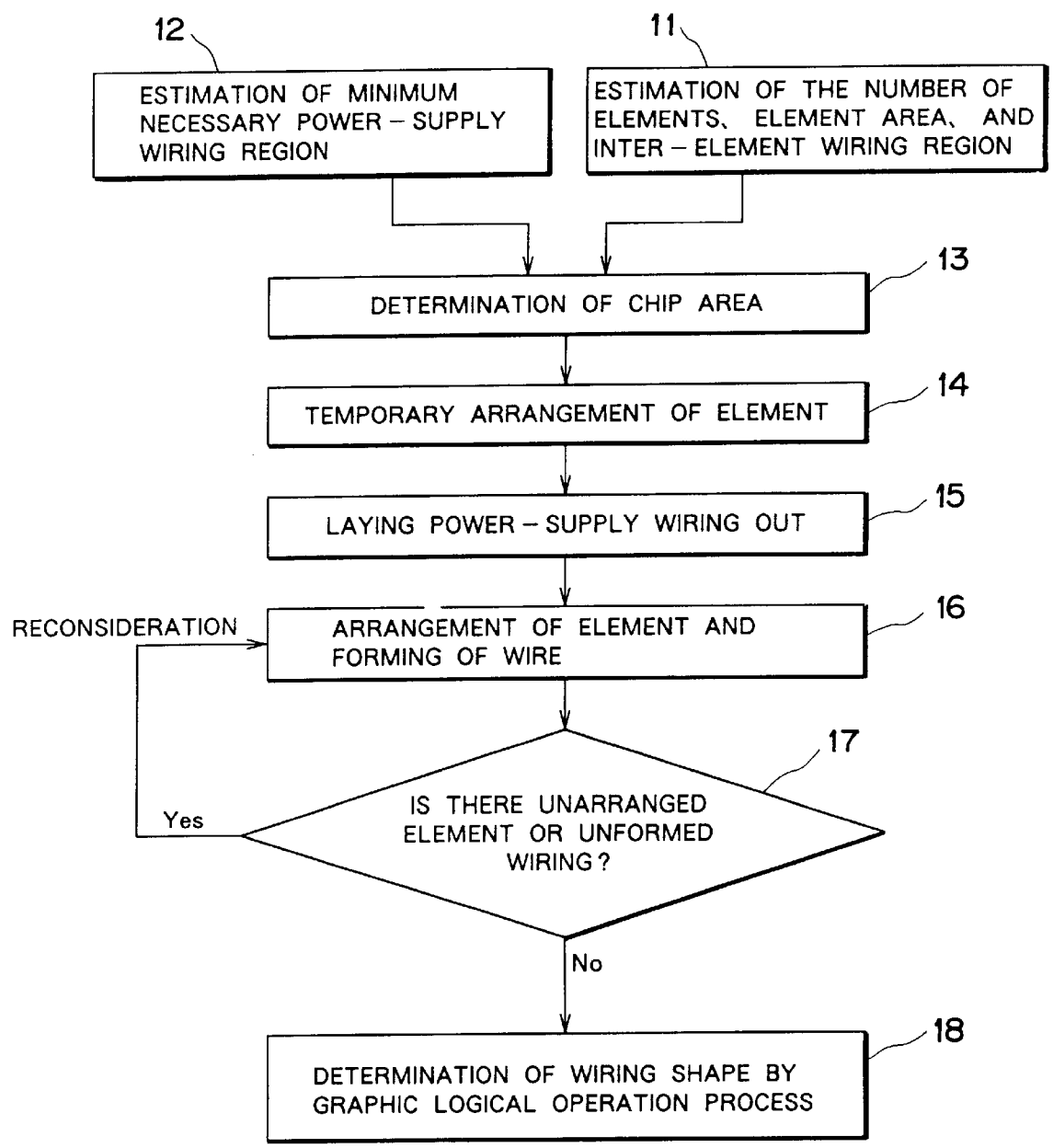

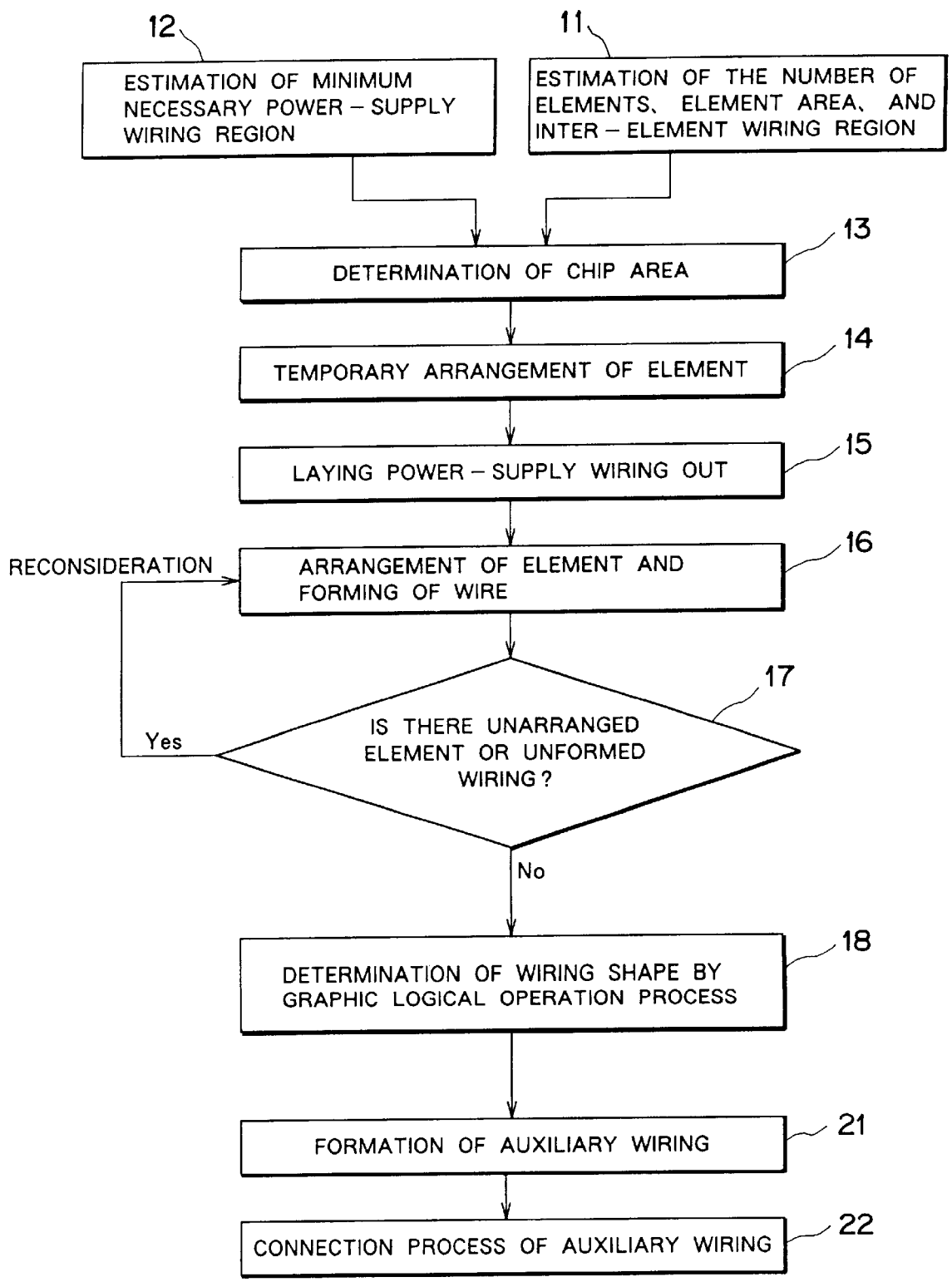

US 6,177,294 B1

WIRING LAYOUT METHOD FOR SEMICONDUCTOR DEVICE AND RECORDING MEDIUM ON WHICH WIRING LAYOUT PROGRAM FOR SEMICONDUCTOR DEVICE IS RECORDED

BACKGROUND OF THE INVENTION

1. Field of the Invention

The present invention relates to a wiring layout method for a semiconductor device in which a power supply wiring layer, a ground wiring layer, and an wiring layer for connecting elements to each other are formed by a plurality of wiring layers, and a recording medium on which a wiring layout program for the semiconductor device is recorded.

2. Description of the Related Art

As a conventional wiring layout method for a semiconductor device, for example, a layout method which sets a pattern shape and a wiring arrangement such that an area where a power supply wiring and a ground wiring oppose is made as large as possible is used (Japanese Patent Application Laid-Open No. 1-239964, Japanese Patent Application Laid-Open No. 5-055380, and the like). The wiring layout method described in Japanese Patent Application Laid-Open No. 1-239964 is called the first prior art, and the semiconductor integrated circuit device described in Japanese Patent Application Laid-Open No. 5-055380 is called the second prior art.

FIG. 1A is a plan view showing the wiring of a semiconductor device in which the wiring is laid out by the wiring layout method according to the first prior art, and FIG. 1B is a sectional view of the wiring in FIG. 1A. Here, as shown in FIGS. 1A and 1B, a wiring layer 55 connecting elements to each other, a ground wiring layer 52, and a power supply wiring layer 53 for on a silicon substrate 51 are laminated. An interlayer insulator 54a is formed between the wiring layer 55 and the ground wiring layer 52, and an interlayer insulator 54b is formed between the ground wiring layer 52 and the power supply wiring layer 53. Power is supplied to an integrated circuit on the substrate 51 by the power supply wiring layer 53 and the ground wiring layer 52 through the interlayer insulators 54a and 54b. The power supply wiring layer 53 and the ground wiring layer 52 formed to oppose through the interlayer insulator 54b constitute a counter electrode of a wiring capacitor.

In the first prior art constructed as described above, a wiring capacitor is formed by using the interlayer insulator 54b, and a counter electrode is constituted by the power supply wiring layer 53 and the ground wiring layer 52. When a bypass capacitor is formed between the power supply wiring layer 53 and the ground wiring layer 52 as described above, power supply noise or the like generated therebetween can be reduced.

FIG. 2A is a plan view showing the wiring structure of a semiconductor integrated circuit device according to the second prior art, and FIG. 2B is a sectional view showing a part of the wiring structure in FIG. 2A. Referring to FIG. 2A, an insulating film 68 formed on the upper most layer in FIG. 2B is not illustrated. As shown in FIGS. 2A and 2B, a plurality of diffusion layers 61a are selectively formed at the surface of a silicon substrate 61, and terminals 61b and the like to which a power supply voltage and a ground potential are applied are formed on the silicon substrate 61, thereby constituting a plurality of active elements. A plurality of interlayer insulators 65a and a plurality of signal wiring layers 62 are alternately laminated on the silicon substrate 61.

In addition, the power supply wiring layer 63 to which a power supply voltage $V_{DD}$ is applied is formed on the interlayer insulator 65a, and the power supply wiring layer 63 is selectively connected to a plurality of pads 67 formed on the peripheral portions of the chip. A interlayer insulator 65b and a ground wiring layer 64 to which a ground potential $V_{SS}$ is applied are sequentially formed on the power supply wiring layer 63. The ground wiring layer 64 is selectively connected to the pads 67. The power supply and ground terminals 61b of the active elements are connected to the power supply wiring layer 63 through a connection via hole 66a formed in the interlayer insulator 65a and connected to the ground wiring layer 64 through a connection via hole 66b formed in the interlayer insulators 65a and 65b.

In the second prior art constructed as described above, when a counter electrode of a wiring capacitor is constituted by the power supply wiring layer 63 and the ground wiring layer 64, electromagnetic noise can be suppressed from being generated.

However, when the layout method according to the first prior art is used, it is considerably difficult to design the optimum shapes of the power supply wiring layer 63 and the ground wiring layer 64. It may be impossible to perform arrangement of the elements and formation of wiring. In addition, when the arrangement region of elements and the formation region of wiring are excessively estimated, a counter area between the power supply wiring layer 63 and the ground wiring layer 64 decreases, and an effective wiring capacitor cannot be obtained. In order to design the optimum shapes of the power supply wiring layer 63 and the ground wiring layer 64, error and trial are repeated a plurality of times. The development period of a semiconductor device extends, and development costs increase.

In the semiconductor integrated circuit device according to the second prior art, the number of days for manufacturing the device and manufacturing costs disadvantageously increase. This is because, in general, even in a semiconductor device obtained by forming two wiring layers, at least three, four, or more wiring layers are required to manufacture an integrated circuit device as shown in FIGS. 2A and 2B.

SUMMARY OF THE INVENTION

It is an object of the present invention to provide a wiring layout method for a semiconductor device, which is capable of easily obtaining a highly reliable semiconductor device at low cost and a recording medium on which a wiring layout program for the semiconductor device are recorded.

The wiring layout method for a semiconductor device according to the present invention comprises the step of determining a chip area and a chip region. Elements are arranged in the chip region, and a wiring for connecting the elements to each other is formed. The shapes of a power supply wiring layer and a ground wiring layer connected to the elements and oppositely arranged to be spaced apart from each other in the direction of the thickness of the chip are determined. The power supply wiring layer and the ground wiring layer are designed such that the counter area between these layers is made as large as possible.

The wiring layout method for a semiconductor device according to the present invention can comprise the step of estimating the number of elements formed in the chip region, an element area, a formation region of a wiring for connecting the elements to each other, and the minimum necessary formation region of the power supply wiring layer and the ground wiring layer, before the step of determining the chip area and the chip region. The chip area and the chip region are preferably determined on the basis of the number of elements, the element area, the formation region of the wiring, and the formation region of the power supply wiring layer and the ground wiring layer.

The wiring layout method for a semiconductor device according to the present invention preferably comprises the steps of temporarily arranging the elements in the chip region and laying out the power supply wiring layer and the ground wiring layer in the minimum necessary formation region, between the step of determining the chip area and the step of arranging elements in the chip region. In the step of arranging the elements, the arrangement positions of the elements can be determined on the basis of net list information used when a circuit of the semiconductor device is designed.

The wiring layout method for a semiconductor device according to the present invention preferably comprises the step of checking whether there are an element which is not arranged and a wiring which is not formed, between the step of arranging the elements and forming a wiring for connecting the elements to each other and the step of determining the shapes of the power supply wiring layer and the ground wiring layer. If there are an unarranged element and an unformed wiring, the flow returns to the step of arranging elements and forming the wiring for connecting elements to each other; and if there are no unarranged element and no unformed wiring, the flow shifts to the step of determining the shapes of the power supply wiring layer and the ground wiring layer.

The wiring layout method for a semiconductor according to the present invention can comprise the steps of forming an auxiliary power supply wiring layer and an auxiliary ground wiring layer, and connecting the auxiliary power supply wiring layer and the power supply wiring layer and connecting the auxiliary ground wiring layer and the ground wiring layer, when a wiring capacitance of the power supply wiring layer and the ground wiring layer is short, after the step of determining the shapes of the power supply wiring layer and the ground wiring layer. The wiring capacitance can be increased by these steps.

A recording medium on which a program of the wiring layout method described above is recorded.

In the present invention, after arrangement of elements and formation of wirings for connecting wirings and the elements to each other and connecting the elements to each other are performed, the shapes of a power supply wiring layer and a ground wiring layer are changed. Therefore, the power supply wiring layer and the ground wiring layer for forming a wiring capacitor can be easily formed in an almost region except for the arranged element region and a region in which the wirings for connecting the wirings and the elements to each other and connecting the elements to each other is formed. As a result, since a chip area can be effectively used, the wiring capacitor can be efficiently formed, and the manufacturing costs of the semiconductor device can be reduced.

In the present invention, since the shapes of the power supply wiring layer and the ground wiring layer are designed such that the counter area between the power supply wiring layer and the ground wiring layer is made as large as possible, the parasitic inductance of the power supply wiring layer can be reduced. As a result, an effective voltage applied to the elements can be suppressed from dropping, and the reliability of the semiconductor device can be improved.

In addition, according to the present invention, since a graphic logical operation process can be used, the shapes of the power supply wiring layer, the ground wiring layer, and the like can be designed by an automatic process performed by a computer or the like. Therefore, the development period of the semiconductor device can be shortened, and the development costs of the semiconductor device can be reduced.

BRIEF DESCRIPTION OF THE DRAWINGS

FIG. 3 is a flow chart showing a wiring layout method for a semiconductor device according to the first embodiment of the present invention;

FIG. 5 is a flow chart showing a wiring layout method for a semiconductor device according to the second embodiment of the present invention.

DESCRIPTION OF THE PREFERRED EMBODIMENTS

Embodiments of the present invention will be described below with reference to the accompanying drawings. FIG. 3 is a flow chart showing a wiring layout method for a semiconductor device according to the first embodiment of the present invention.

As shown in FIG. 3, the number of elements, an element area, and an inter-element wiring region are estimated on the basis of net list information during circuit design (step 11). The minimum necessary power supply wiring region defined in consideration of migration and impedance is estimated on the basis of simulation information obtained by calculating a current flowing in a wiring connected to the elements (step 12). A chip area is determined on the basis of the results obtained in steps 11 and 12 (step 13), and the elements are temporarily arranged on a chip (step 14). In step 14, the arrangement of the elements is not determined, but the elements are temporarily arranged such that the elements can be rearranged later.

Thereafter, on the basis of the simulation information for current calculation and the net list information, a power supply wiring layer and a ground wiring layer are laid out (step 15) such that the power supply wiring connected to the elements can be increased with respect to the elements which require a large amount of current. Thereafter, an element 31 is arranged on the basis of the net list information in a rectangular region defined in a planar view by the ground wiring layer and the power supply wiring layer which are laid out, and a wiring for connecting the power supply wiring layer and the ground wiring layer to each other and connecting elements to each other is formed (step 16).

Thereafter, it is checked on the basis of the net list information (step 17) whether there is an element which is not arranged or a wiring which is not formed. If there is an element which is not arranged or a wiring which is not formed (Yes), the flow returns to step 16. At this time, when all elements cannot be arranged or all wiring layers cannot be formed, the positions of the elements are changed to be rearranged. If there is no element which is not arranged or no wiring which is not formed (No) in step 17, a graphic logical operation process for a wiring shape is performed on the basis of information for designating a wiring on which a wiring capacitor is loaded and the capacitance of the wiring capacitor such that the counter area between the power supply wiring layer and the ground wiring layer which are opposite to each other is larger. The wiring shapes of the ground wiring layer and the power supply wiring layer are changed, and the ground wiring layer and the power supply wiring layer which are oppositely arranged in the direction of the thickness of the semiconductor substrate serves as a counter electrode of the wiring capacitor (step 18).

Figure 1A:
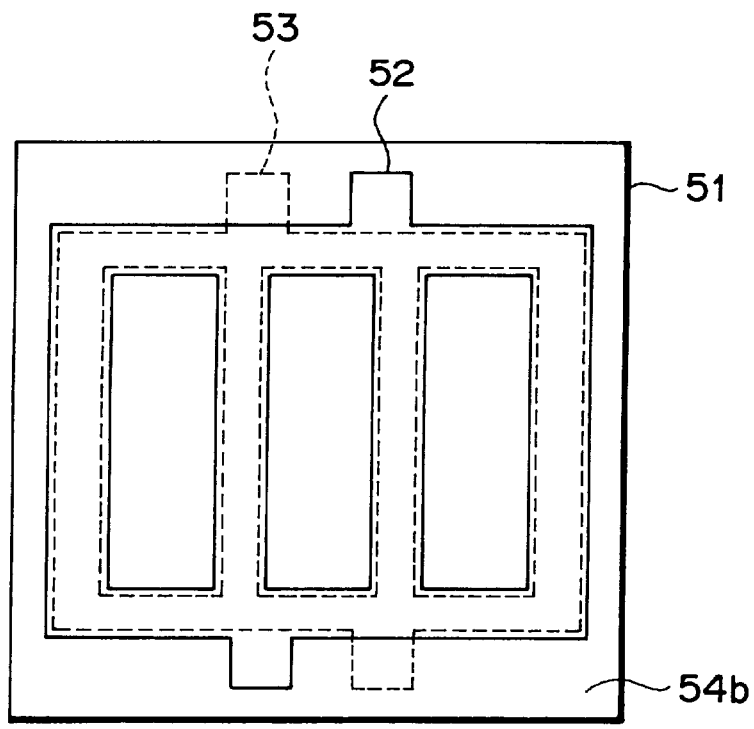
FIG. 1A is a plan view showing the wiring of a semiconductor device in which the wiring is laid out by a wiring layout method according to the first prior art.
Figure 1B:
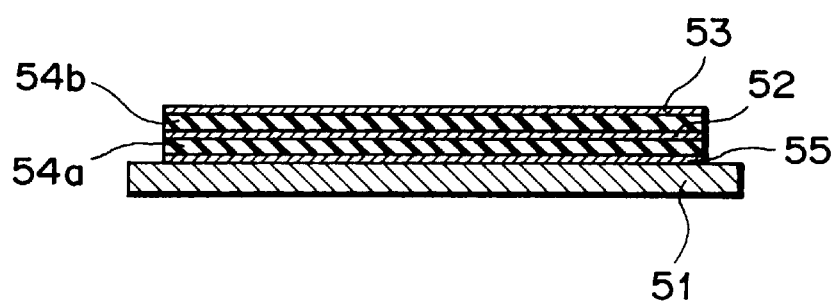
FIG. 1B is a sectional view of the wiring in FIG. 1A.
Figure 2A:
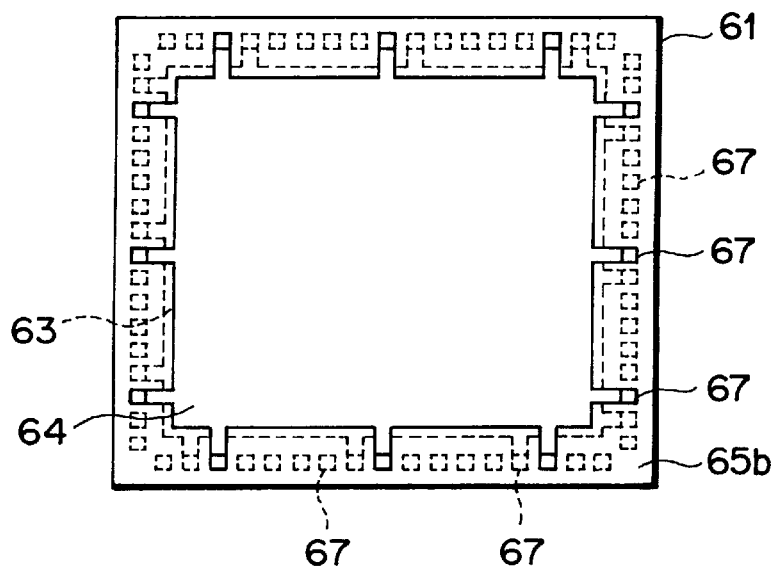
FIG. 2A is a plan view showing the wiring structure of a semiconductor integrated circuit device according to the second prior art.
Figure 2B:
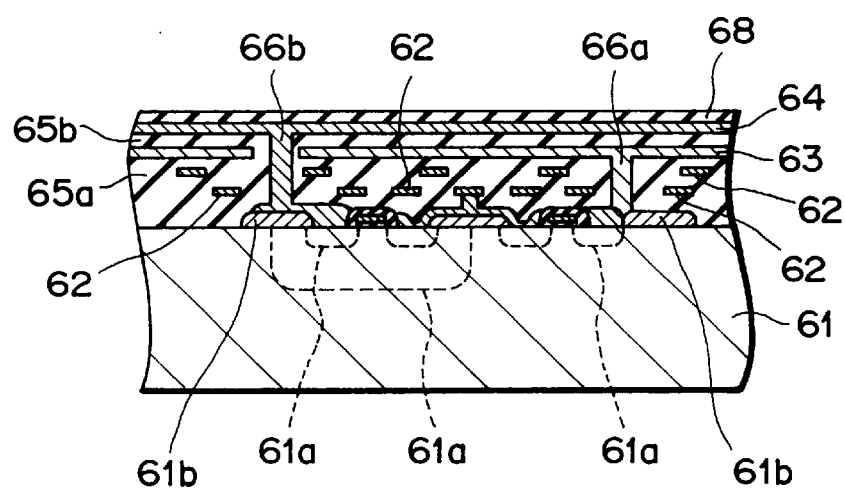
FIG. 2B is a sectional view showing a part of the wiring structure in FIG. 2A.
Figure 4A:
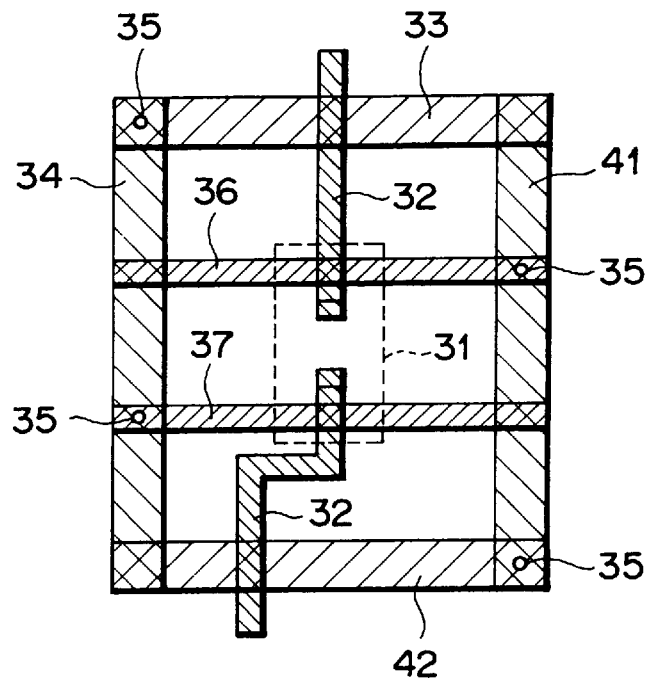
FIGS. 4A and 4B are plan views showing wiring shapes laid out by the wiring layout method shown in FIG. 3 in the order of steps.
Figure 4B:
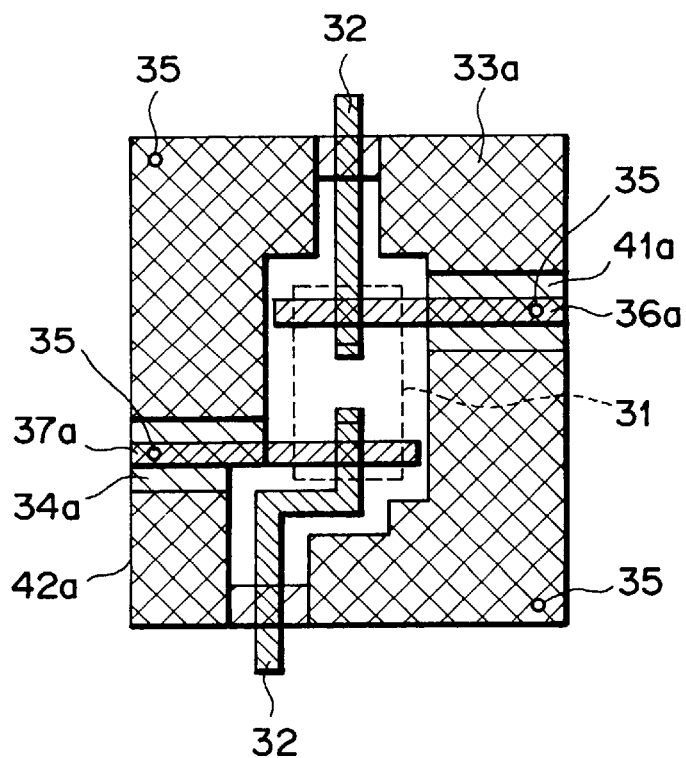

FIGS. 4A and 4B are plan views showing wiring shapes laid out by the wiring layout method shown in FIG. 3 in the order of steps. Referring to FIGS. 4A and 4B, two wiring layers are indicated by inclined lines, and an element is indicated by a region defined a dotted line. The first wiring layer and the second wiring layer are indicated by inclined lines which are different from each other in direction. FIG. 4A shows a wiring shape formed in the steps up to step 18, and FIG. 4B shows a wiring shape determined in step 18.

As shown in FIG. 4A, the element 31 is temporarily arranged on the surface of a semiconductor substrate (not shown). On the basis of a simulation result obtained by calculating currents flowing in a power supply drawing line 36 and a ground drawing line 37 connected to the element 31, first and second ground wiring layers 33 and 34, and first and second power supply wiring layers 42 and 41, the minimum necessary wiring width of all the wiring layers is set, and the wiring layers are laid out.

In this manner, the power supply drawing line 36 and the ground drawing line 37 are formed on the element 31, and the element 31 is connected to the drawing lines 36 and 37. The first ground wiring layer 33 and the first power supply wiring layer 42 are formed in the same layer as that of the power supply drawing line 36 and the ground drawing line 37. In addition, the second ground wiring layer 34 and the second power supply wiring layer 41 are formed above the first ground wiring layer 33 and the first power supply wiring layer 42 through an interlayer insulator (not shown). Since the first ground wiring layer 33 and the second ground wiring layer 34 are formed in the different layers, respectively, the first ground wiring layer 33 and the second ground wiring layer 34 are connected by a connection via hole 35. Since the first power supply wiring layer 42 and the second power supply wiring layer 41 are also formed in different layers, respectively, the first power supply wiring layer 42 and the second power supply wiring layer 41 are connected by the connection via hole 35.

Furthermore, the first and second ground wiring layers 33 and 34 are connected to the ground drawing line 37 by the connection via hole 35, and the first and second power supply wiring layers 42 and 41 are connected to the power supply drawing line 36 by the connection via hole 35. In this manner, temporary arrangement of all the elements and temporary formation of the wiring layers are completed. After it is determined that there are no unarranged element and no unformed wiring, the element 31 is actually arranged, and an inter-element wiring layer 32 for connecting the element 31 and another element to each other is formed.

Thereafter, in step 18, on the basis of information for designating the wiring on which the wiring capacitor is loaded and the capacitance of the wiring capacitor, a graphic logical operation process is performed to the designated wiring. For this reason, the shapes of the first and second ground wiring layers 33 and 34, the first and second power supply wiring layers 42 and 41, the power supply drawing line 36, and the ground drawing line 37 are changed. For example, as shown in FIG. 4B, first and second ground wiring layers 33a and 33a, first and second power supply wiring layers 42a and 41a, a power supply drawing line 36a, and a ground drawing line 37a are obtained. As a result, the counter area between the ground wiring layers 33a and 33a and the power supply wiring layers 42a and 41a is larger than the counter area between the ground wiring layers 33 and 34 and the power supply wiring layers 42 and 41. Therefore, the wiring capacitance of the resultant wiring can be made higher than that of the wiring laid out in the steps up to step 18.

According to a conventional wiring layout method, before arrangement of elements on a semiconductor substrate and formation of a wiring for connecting the elements to each other, the shapes of a power supply wiring layer and a ground wiring layer are designed. At this time, in order to made the counter area between the power supply wiring layer and the ground wiring layer as large as possible, the number of elements, an element area, the arrangement positions of the elements, and the connection relationship between the elements must be considered. However, since the number of combinations of these factors is very large, all the factors cannot be actually considered. Therefore, even if the conventional wiring layout method is used, the shapes of the power supply wiring layer and the ground wiring layer cannot be easily designed.

In contrast to this, in the first embodiment, after the arrangement of elements and formation of a wiring for connecting a wiring and the elements to each other and connecting the elements to each other, the shapes of the power supply wiring layer and the ground wiring layer are changed. Therefore, the power supply wiring layer and the ground wiring layer for forming a wiring capacitor can be easily formed in an almost region except for the arranged element region and a region in which the wiring for connecting the wiring and the elements to each other and connecting the elements to each other is formed. As a result, since a chip area can be effectively used, the wiring capacitor can be efficiently formed, and the manufacturing costs of the semiconductor device can be reduced.

In this embodiment, since the shapes of the power supply wiring layer and the ground wiring layer are designed such that the counter area between the power supply wiring layer and the ground wiring layer is made as large as possible, the parasitic inductance of the power supply wiring layer can be reduced. As a result, an effective voltage applied to the elements can be suppressed from dropping, and the reliability of the semiconductor device can be improved.

In addition, according to this embodiment, since a graphic logical operation process is used, the shapes of the power supply wiring layer, the ground wiring layer, and the like can be designed by an automatic process performed by a computer or the like. Therefore, the development period of the semiconductor device can be shortened, and the development costs of the semiconductor device can be reduced.

Figure 6A:
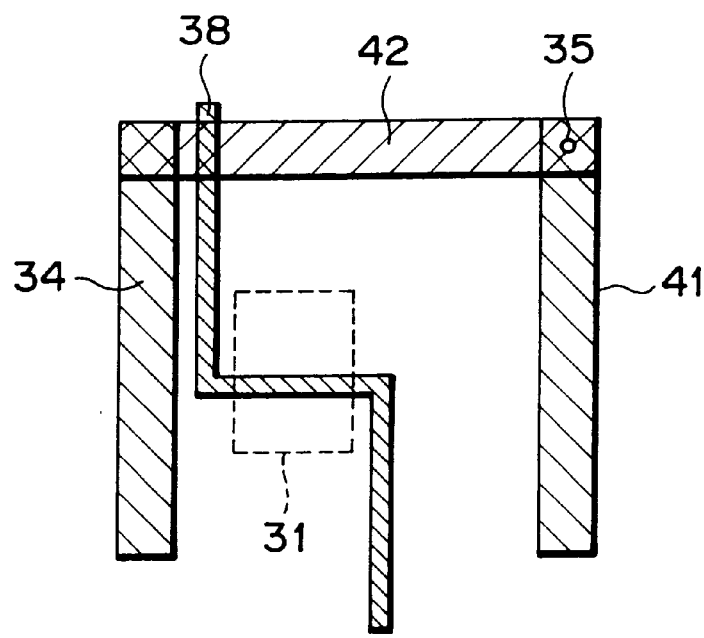
FIGS. 6A and 6B are plan views showing wiring shapes laid out by the wiring layout method shown in FIG. 5 in the order of steps.
Figure 6B:
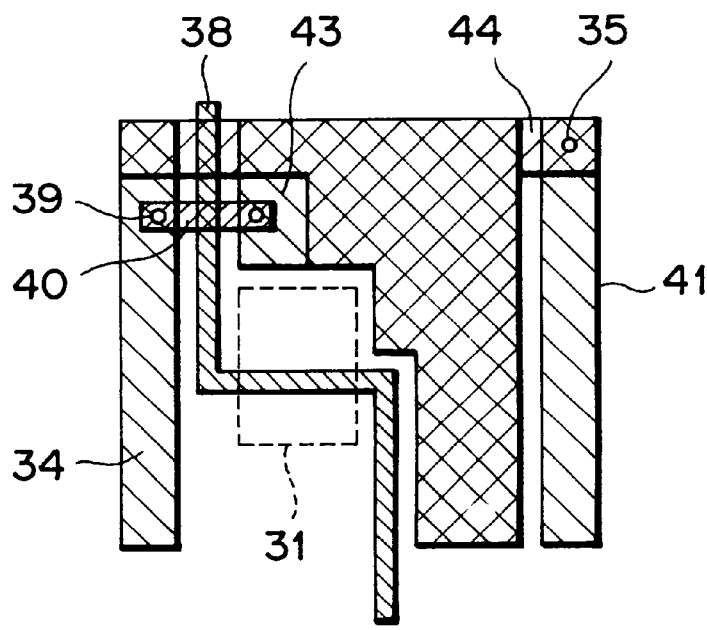

FIG. 5 is a flow chart showing a wiring layout method for a semiconductor device according to the second embodiment of the present invention. FIGS. 6A and 6B are plan views showing wiring shapes laid out by the wiring layout method shown in FIG. 5 in the order of steps. The second embodiment shown in FIG. 5 is different from the first embodiment shown in FIG. 3 in only that step 21 and step 22 are added. Therefore, the same reference numerals as in FIG. 3 and FIGS. 4A and 4B denote the same parts in FIG. 5 and the FIGS. 6A and 6B, and a description thereof will be omitted.

In the second embodiment, when a wiring capacitance is short after step 18 for executing a graphic logical operation process for a wiring shape, auxiliary wiring layers are respectively formed in available regions, in which the elements, other wiring layers, and the like are not formed, in rectangular regions which are defined for the power supply wiring layer and the ground wiring layer in a planar view (step 21). Thereafter, the wiring formed on the upper layer side is connected to the auxiliary wiring layer, and the wiring formed on the lower layer side is connected to the auxiliary wiring layer (step 22).

As shown in FIG. 6A, after the graphic logical operation process for the wiring shape in step 18, a through wiring layer 38 passing over the element 31, the ground wiring layer 34, the first power supply wiring layer 42, and the second power supply wiring layer 41 are formed. The first power supply wiring layer 42 and the second power supply wiring layer 41 are connected to each other by the connection via hole 35. However, depending on these wiring shapes, a wiring capacitor cannot be effectively formed, and an available capacitor may be left. In FIG. 6A, since the through wiring layer 38 passing over the element 31 is formed in the same layer as that of the ground wiring layer 34, the wiring shape of the ground wiring layer 34 cannot be changed. However, an available region which an element, other wiring layers, and the like are not formed is left in the rectangular region.

Therefore, by step 21, as shown in FIG. 6B, when the capacitance of a wiring which requires a very large wiring capacitance is short, an auxiliary ground wiring layer 43 is formed in the available region in the rectangular region. A connection ground wiring layer 40 for connecting the ground wiring layer 34 and the auxiliary ground wiring layer 43 to each other is formed. In addition, the shape of the first power supply wiring layer 42 is changed, and the third power supply wiring layer 44 is obtained. Thereafter, by step 22, the ground wiring layer 34 and the auxiliary ground wiring layer 43 are connected to each other through the connection ground wiring layer 40 and the connection via hole 39. This connection process is preferably executed by an automatic wiring tool.

As in the second embodiment in which the wiring layout is designed as described above, the same effect as that of the first embodiment can be obtained. When the method according to the second embodiment is used, even if a power supply wiring layer and a ground wiring layer for effectively forming a wiring capacitor in step 18 cannot be obtained, the power supply wiring layer and the ground wiring layer can be efficiently formed in an available region. Therefore, a counter electrode for forming a more effective wiring capacitor can be obtained.

In the present invention, by using a recording medium on which the above steps are recorded, a computer is caused to execute the wiring layout program on the recording medium, so that the wiring layers of the semiconductor device can be laid out.

What is claimed is:

1. A wiring layout method for a semiconductor comprising the steps of:
    determining a chip area and a chip region;
    arranging elements in said chip region and forming a wiring for connecting said elements to each other; and
    determining shapes of a power supply wiring layer and a ground wiring layer connected to said elements and oppositely arranged to be spaced apart from each other in a direction of the thickness of said chip, said power supply wiring layer and said ground wiring layer being designed such that a counter area therebetween is made as large as possible.

2. A wiring layout method for a semiconductor device according to claim 1, comprising the step of:
    estimating a number of elements formed in said chip region, an element area, a formation region of a wiring for connecting said elements to each other, and a minimum necessary formation region of said power supply wiring layer and said ground wiring layer, before said step of determining said chip area and said chip region, wherein said chip area and said chip region are determined on the basis of the number of elements, an element area, a formation region of said wiring, and a formation region of said power supply wiring layer and said ground wiring layer.

3. A wiring layout method for a semiconductor device according to claim 2, wherein said formation region of said wiring is estimated on the basis of net list information used when a circuit of said semiconductor device is designed.

4. A wiring layout method for a semiconductor device according to claim 2, wherein said formation region of said power supply wiring layer and said ground wiring layer is estimated on the basis of a simulation information obtained by calculating currents flowing in said power supply wiring layer and said ground wiring layer.

5. A wiring layout method for a semiconductor device according to claim 1, wherein said shapes of said power supply wiring layer and said ground wiring layer are determined by a graphic logical operation process using a computer.

6. A wiring layout method for a semiconductor device according to claim 5, wherein said graphic logical operation process is performed on the basis of information for designating a wiring on which a wiring capacitor is loaded and a capacitance of a wiring capacitor.

7. A wiring layout method for a semiconductor device according to claim 1, wherein said power supply wiring layer and said ground wiring layer constitute a counter electrode for forming a wiring capacitor.

8. A wiring layout method for a semiconductor device according to claim 1, comprising the steps of:
    temporarily arranging said elements in said chip region; and
    laying out said power supply wiring layer and said ground wiring layer in said minimum necessary formation region, between said step of determining said chip area and said step of arranging elements in said chip region, wherein, in said step of arranging said elements, arrangement positions of said elements are determined on the basis of net list information used when a circuit of said semiconductor device is designed.

9. A wiring layout method for a semiconductor device according to claim 8, wherein said power supply wiring layer and said ground wiring layer are laid out on the basis of simulation information of current calculation and said net list information.

10. A wiring layout method for a semiconductor according to claim 1, comprising the step of:
    checking whether there are an element which is not arranged and a wiring which is not formed, between said step of arranging said elements and forming a wiring for connecting said elements to each other and said step of determining said shapes of said power supply wiring layer and said ground wiring layer, wherein, if there are an unarranged element and an unformed wiring, the flow returns to said step of arranging elements and forming a wiring for connecting elements to each other; and if there are no unarranged element and no unformed wiring, the flow shifts to said step of determining said shapes of said power supply wiring layer and said ground wiring layer.

11. A wiring layout method for a semiconductor device according to claim 1, comprising the steps of:

forming an auxiliary power supply wiring layer and an auxiliary ground wiring layer; and connecting said auxiliary power supply wiring layer and said power supply wiring layer and connecting said auxiliary ground wiring layer and said ground wiring layer, when a wiring capacitance of said power supply wiring layer and said ground wiring layer is short, after said step of determining said shapes of said power supply wiring layer and said ground wiring layer, whereby said wiring capacitance is increased.

* * * * *